United States Patent
Ichiki et al.

(10) Patent No.: US 6,858,838 B2
(45) Date of Patent: Feb. 22, 2005

(54) NEUTRAL PARTICLE BEAM PROCESSING APPARATUS

(75) Inventors: Katsunori Ichiki, Kanagawa (JP); Kazuo Yamauchi, Kanagawa (JP); Hirokuni Hiyama, Kanagawa (JP); Seiji Samukawa, Miyagi (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/451,635

(22) PCT Filed: Mar. 22, 2002

(86) PCT No.: PCT/JP02/02748
§ 371 (c)(1),
(2), (4) Date: Dec. 1, 2003

(87) PCT Pub. No.: WO02/078040
PCT Pub. Date: Oct. 3, 2002

(65) Prior Publication Data
US 2004/0074604 A1 Apr. 22, 2004

(30) Foreign Application Priority Data
Mar. 26, 2001 (JP) ........................................ 2001-088860

(51) Int. Cl.[7] .............................................. H01L 21/306
(52) U.S. Cl. ................ 250/251; 250/423 R; 313/359.1; 313/362.1; 313/363.1; 315/111.21; 315/111.31; 156/345.39
(58) Field of Search ............................. 250/251, 423 R; 313/359.1, 362.1, 363.1; 315/111.21, 111.31

(56) References Cited

U.S. PATENT DOCUMENTS

| | | | | | |
|---|---|---|---|---|---|
| 5,518,572 | A | * | 5/1996 | Kinoshita et al. | ...... 156/345.34 |
| 5,818,040 | A | * | 10/1998 | Kinoshita et al. | ............ 250/251 |
| 2004/0070348 | A1 | * | 4/2004 | Ichiki et al. | ................... 440/90 |
| 2004/0108470 | A1 | * | 6/2004 | Ichiki et al. | ............ 250/492.21 |

FOREIGN PATENT DOCUMENTS

| | | |
|---|---|---|
| EP | 0 367 568 A1 | 5/1990 |
| EP | 0 522 296 A2 | 1/1993 |
| EP | 0 658 917 A2 | 6/1995 |

* cited by examiner

*Primary Examiner*—Nikita Wells
(74) *Attorney, Agent, or Firm*—Westerman, Hattori, Daniels & Adrian, LLP

(57) ABSTRACT

A neutral particle beam processing apparatus comprises a plasma generator for generating positive ions and/or negative ions in a plasma, a pair of electrodes (5, 6) involving the plasma generated by the plasma generator therebetween, and a power supply (102) for applying a voltage between the pair of electrodes (5, 6). The pair of electrodes (5, 6) accelerate the positive ions and/or the negative ions generated by the plasma generator. The positive ions and/or the negative ions are neutralized and converted into neutral particles while being drifted in the plasma between the pair of electrodes (5, 6) toward a workpiece (X). The accelerated neutral particles pass through one of the electrodes (6) and are applied to the workpiece (X).

8 Claims, 3 Drawing Sheets

F I G. 3
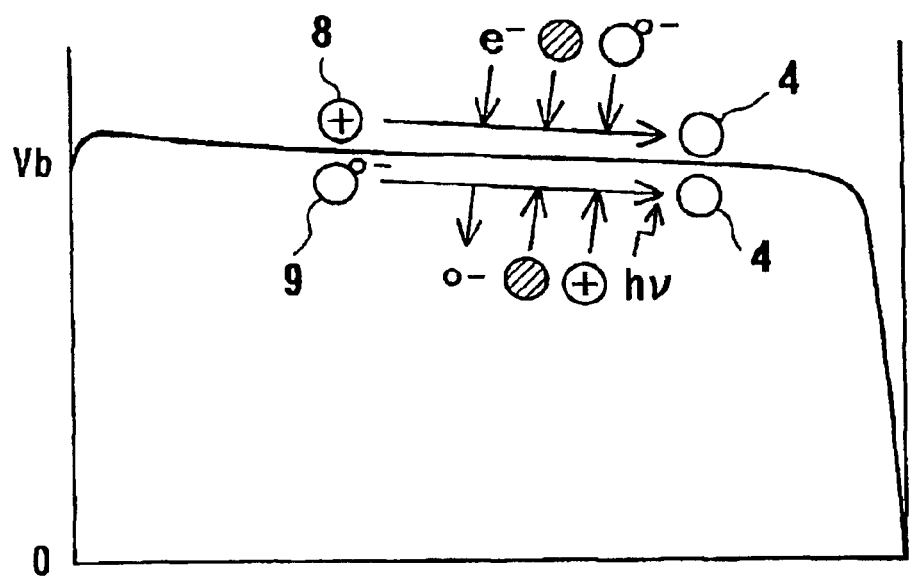

NEUTRAL PARTICLE BEAM PROCESSING APPARATUS

TECHNICAL FIELD

The present invention relates to a neutral particle beam processing apparatus, and more particularly to a neutral particle beam processing apparatus for generating a highly directional and highly dense neutral particle beam from a high-density plasma and processing a workpiece with the generated neutral particle beam.

BACKGROUND ART

In recent years, semiconductor integrated circuits, information storage media such as hard disks, micromachines, and the like have been processed in highly fine patterns. In the fields of processing such workpieces, attention has been attracted to the use of an energetic beam such as a high-density neutral particle beam or a high-density ion beam which is highly linear, i.e., highly directional, and has a relatively large beam diameter. For example, the energetic beam is applied to a workpiece for depositing a film thereon or etching the workpiece.

As beam sources of such energetic beams, there have been used beam generators which generate various kinds of beams including a positive ion beam, a negative ion beam, a neutral particle beam, and a radical beam. The positive ion beam, the negative ion beam, the neutral particle beam, or the radical beam is applied to a desired area of a workpiece from the beam source, for thereby locally depositing a film on the workpiece, etching the workpiece, modifying the surface of the workpiece, or joining or bonding parts of the workpiece.

When charged particles are applied to a workpiece such as an extremely thin silicon oxide film for semiconductor integrated circuits, a dielectric breakdown may be caused on the workpiece. However, a neutral particle beam having no electric charges but having a large translational energy is unlikely to damage a workpiece. Therefore, it has been expected to apply such a neutral particle beam to fine processes.

As a beam source of such a neutral particle beam, there has been known a beam generator which generates a negative ion beam from a plasma and detaches electrons from the negative ion beam by electron impact for thereby neutralizing the negative ion beam. This neutral particle beam generator comprises a neutralizing chamber having a filament therein. Thermoelectrons produced by the filament are trapped in the neutralizing chamber to generate an electron cloud having a high energy. The negative ion beam which has been focused with an electrostatic lens is introduced into the neutralizing chamber and neutralized by detaching electrons while passing through the electron cloud in the neutralizing chamber.

In the case where the negative ions are neutralized by electron impact, it is required to generate a high-density electron cloud in order to obtain a high neutralization efficiency. However, since a high-density electron cloud is generated only in an extremely small space, the beam diameter of the neutral particle beam cannot be made larger.

There has been known another neutral particle beam generator which irradiates photons to a negative ion beam to detach electrons therein for thereby neutralizing the negative ion beam. In this neutral particle beam generator, since a photon energy is larger than an electron detachment energy from the negative ion beam, a high neutralization efficiency can be obtained without dependence upon the energy of the negative ion beam.

In the case where the negative ions are neutralized by application of photons, a large light source and a large optical system are required to make the beam diameter of the neutral particle beam larger, resulting in a larger size of the apparatus. Only a slight part of light emitted from the light source contributes to neutralization, and the rest of light becomes heat loss. In order to obtain a high neutralization efficiency, the light source is required to have a higher fluence. However, the light source having a higher fluence needs a cooling mechanism or the like, resulting in a larger size of apparatus and a higher cost of the equipments.

If a radiation (e.g., an ultraviolet ray) produced by the plasma in the neutral particle beam source is applied to the workpiece, then the radiation adversely affects the workpiece. Thus, it is necessary to shield the workpiece from an adverse radiation (e.g., an ultraviolet ray) emitted from the plasma source.

DISCLOSURE OF INVENTION

The present invention has been made in view of the above drawbacks. It is therefore an object of the present invention to provide a neutral particle beam processing apparatus which can apply an energetic beam having a large beam diameter to a workpiece with an inexpensive and compact structure, and can highly accurately perform a process such as an etching process or a deposition process on the workpiece without a damage.

In order to attain the above object, there is provided a neutral particle beam processing apparatus comprising: a plasma generator for generating at least one of positive ions and negative ions in a plasma; a pair of electrodes involving the plasma generated by the plasma generator therebetween; and a power supply for applying a voltage between the pair of electrodes; wherein the pair of electrodes accelerate the at least one of positive ions and negative ions generated by the plasma generator; the at least one of positive ions and negative ions are neutralized and converted into neutral particles while being drifted in the plasma between the pair of electrodes toward a workpiece; and the accelerated neutral particles pass through one of the electrodes and are applied to the workpiece.

With the above arrangement, at least one of positive ions and negative ions are generated in a plasma by the plasma generator. The pair of electrodes involves the plasma generated by the plasma generator therebetween, and the power supply applies a voltage between the pair of electrodes. Therefore, at least one of positive ions and negative ions can be accelerated toward the workpiece. The accelerated positive or negative ions are neutralized and converted into neutral particles while being drifted in the plasma. Since the neutral particles have kinetic energy, they pass through the electrode nearer to the workpiece and are applied to the workpiece. Therefore, it is easy to generate a high-density plasma having a large beam diameter and to thus obtain a neutral particle beam having a large beam diameter from the above plasma. With a processing apparatus using such a neutral particle beam, various processes including an etching process and a deposition process can be performed on the workpiece with high accuracy in such a state that an amount of charge build-up is reduced.

According to a preferred aspect of the present invention, the plasma generator alternately performs application of a high-frequency voltage and interruption of the high-frequency voltage repeatedly; and the at least one of positive ions and negative ions generated by the plasma generator are extracted from the plasma and accelerated in a predetermined direction while the high-frequency voltage is being interrupted.

By alternately performing application of a high-frequency voltage and interruption of the high-frequency voltage repeatedly, it is possible to generate a large quantity of negative ions as well as positive ions in the plasma. While the high-frequency voltage is being interrupted, the positive ions or the negative ions generated by the plasma generator are accelerated according to an electric field generated by a voltage applied between plural electrodes. Accordingly, the positive ions or the negative ions in the plasma can be drifted toward the workpiece.

One of the electrodes should preferably comprise a meshed electrode. With the meshed electrode, a neutral particle beam generated from the positive ions or the negative ions can efficiently be extracted to the workpiece. Specifically, it is possible to obtain a neutral particle beam having a large diameter without complicated mechanisms.

According to a preferred aspect of the present invention, the pair of electrodes are opposed to each other with interposing therebetween a space in which the plasma is generated by the plasma generator, and a drift space through which the at least one of positive ions and negative ions in the plasma are drifted toward the workpiece for thereby being neutralized and converted into neutral particles.

With the above arrangement, from a plasma having a large beam diameter, it is possible to generate a neutral particle beam having the same diameter as the plasma without complicated neutralization devices.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 3 is a graph showing a potential distribution between electrodes in the neutral particle beam processing apparatus shown in FIG. 1, in which neutralization of positive ions or negative ions at a downstream part of a plasma space is schematically shown.

BEST MODE FOR CARRYING OUT THE INVENTION

A neutral particle beam processing apparatus according to a first embodiment of the present invention will be described in detail below with reference to FIGS. 1 through 3.

Figure 1:
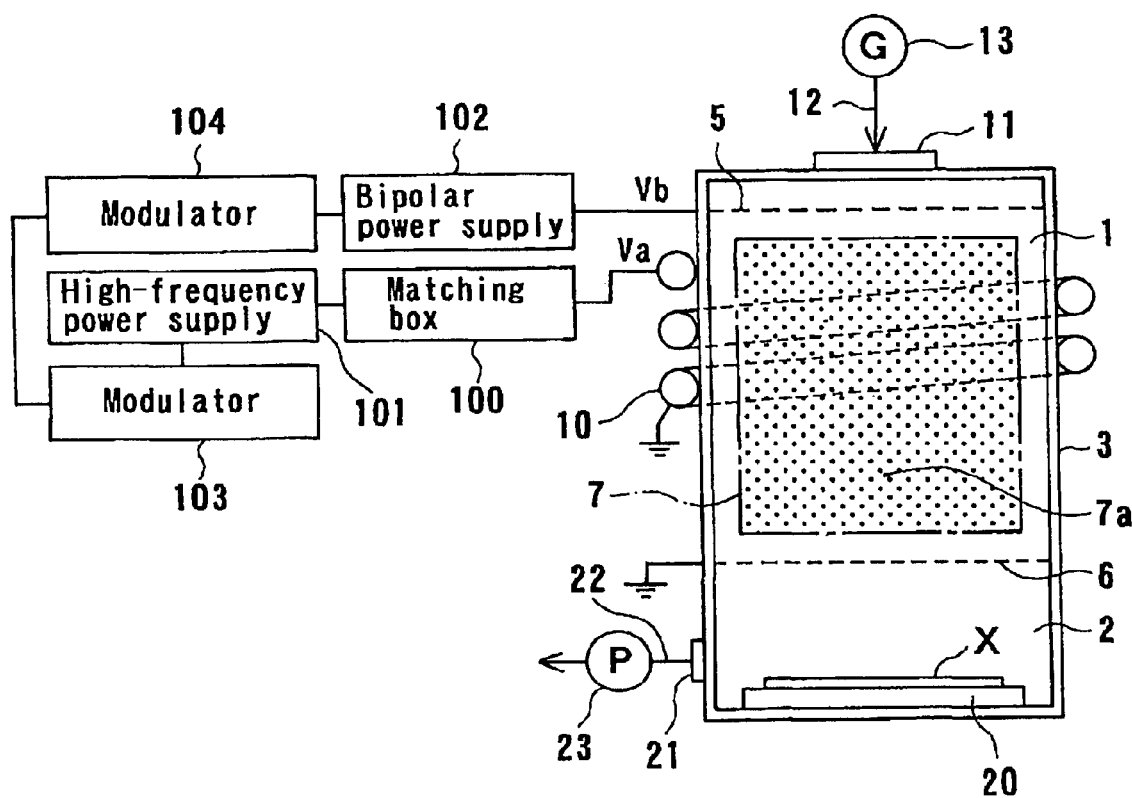
FIG. 1 is a schematic view showing a whole arrangement of a neutral particle beam processing apparatus according to a first embodiment of the present invention.
Figure 2:
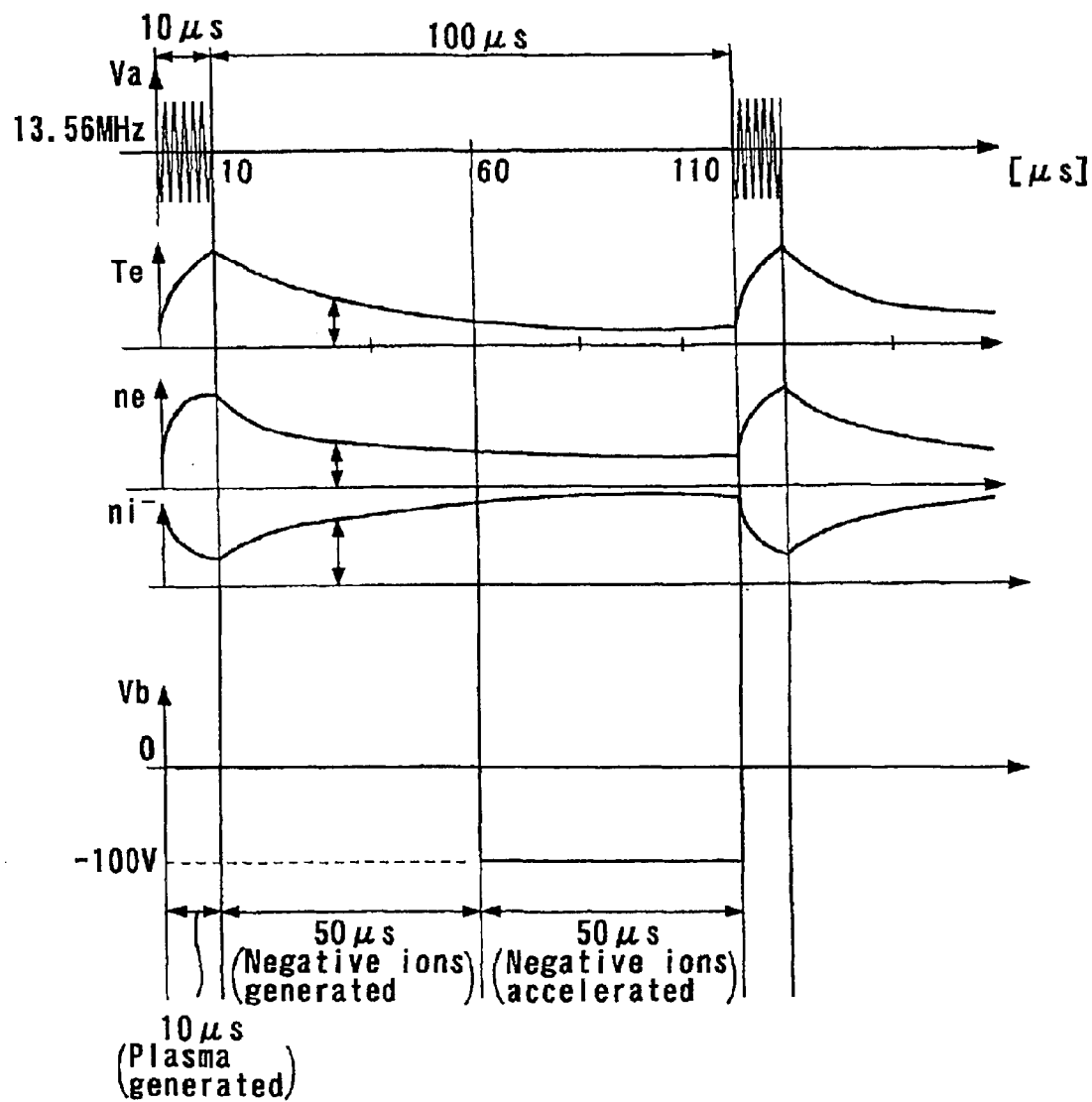
FIG. 2 is a timing chart showing operating states of the neutral particle beam processing apparatus shown in FIG. 1.

FIG. 1 is a schematic view showing a whole arrangement of a neutral particle beam processing apparatus according to a first embodiment of the present invention, with electric components in block form. As shown in FIG. 1, the neutral particle beam processing apparatus comprises a cylindrical vacuum chamber 3 constituted by a beam generating chamber 1 for generating a neutral particle beam and a process chamber 2 for processing a workpiece X such as a semiconductor substrate, a glass workpiece, an organic workpiece, a ceramic workpiece, or the like. The vacuum chamber 3 has walls made of quartz glass, ceramics, metal, or the like.

The beam generating chamber 1 has a coil 10 disposed therearound for inductively coupled plasma (ICP). The coil 10 is housed in a water-cooled tube having an outside diameter of 8 mm, for example. The coil 10 of about two turns is wound around the beam generating chamber 1. The coil 10 is electrically connected through a matching box 100 to a high-frequency power supply 101, which applies a high-frequency voltage having a frequency of about 13.56 MHz, for example, to the coil 10. When a high-frequency current is supplied from the high-frequency power supply 101 via the matching box 100 to the coil 10, an induced magnetic field is produced in the beam generating chamber 1 by the coil 10. The varying magnetic field induces an electric field. The electric field accelerates electrons, which ionizes atoms and molecules in a gas to generate a plasma in the beam generating chamber 1. Thus, the coil 10, the matching box 100, and the high-frequency power supply 101 constitute a plasma generator for generating a plasma in the beam generating chamber 1.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the beam generating chamber 1.

The process chamber 2 houses a workpiece holder 20 therein for holding a workpiece X. The workpiece X is placed on an upper surface of the workpiece holder 20. The process chamber 2 has a gas outlet port 21 defined in a sidewall thereof for discharging the gas from the process chamber 2. The gas outlet port 21 is connected through a gas outlet pipe 22 to a vacuum pump 23, which operates to maintain the process chamber 2 at a predetermined pressure.

An electrode 5 made of an electrically conductive material such as graphite is disposed in the upper end of the beam generating chamber 1. The electrode 5 is electrically connected to a bipolar power supply (voltage applying unit) 102. A thin-plate meshed electrode 6 made of an electrically conductive material is disposed in the lower end of the beam generating chamber 1 and electrically grounded. These electrodes 5, 6 are opposed to each other with interposing therebetween a plasma space 7 for a plasma generated by the coil 10 for ICP. The plasma space 7 has a space where a plasma is generated by the plasma generator, and a drift space 7a through which positive ions and/or negative ions in the plasma are drifted toward the workpiece for thereby being neutralized and converted into neutral particles. The positive ions and the negative ions in the plasma are accelerated by a voltage applied by the bipolar power supply (voltage applying unit) 102 connected between the electrodes 5, 6 and flown through the drift space 7a toward the workpiece X.

The high-frequency power supply 101 which is connected to the coil 10 is connected a modulator 103, and the bipolar power supply 102 which is connected to the electrode 5 is connected to a modulator 104. Thus, the high-frequency power supply 101 and the bipolar power supply 102 are connected to each other through the modulators 103, 104. The application of the voltage by the bipolar power supply 102 is synchronized with the application of the voltage by the high-frequency power supply 101, based on synchronizing signals transmitted between the modulators 103, 104.

Operation of the neutral particle beam processing apparatus according to the first embodiment will be described below. FIG. 2 is a timing chart showing operating states of the neutral particle beam processing apparatus shown in FIG. 1. In FIG. 2, Va represents the potential of the coil 10, Te the electron temperature in the beam generating chamber 1, ne the electron density in the beam generating chamber 1, ni⁻ the negative ion density in the beam generating chamber 1, and Vb the potential of the electrode 5. The timing chart is schematically shown in FIG. 2, and the shown frequencies are different from the actual frequencies, for example.

The vacuum pump 23 is driven to evacuate the vacuum chamber 3. After the vacuum chamber 3 reaches a predetermined degree of vacuum, a gas such as $SF_6$, $CHF_3$, $CF_4$, $Cl_2$, Ar, $O_2$, $N_2$, or $C_4F_8$ is introduced from the gas supply source 13 into the beam generating chamber 1. As shown in FIG. 2, a high-frequency voltage having a frequency of about 13.56 MHz is applied to the coil 10 for 10 microseconds by the high-frequency power supply 101, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1. The plasma is mainly composed of positive ions and heated electrons.

Then, the high-frequency voltage applied by the high-frequency power supply 101 is interrupted for 100 microseconds. Thereafter, the high-frequency voltage is applied again to the coil 10 for 10 microseconds by the high-frequency power supply 101 to heat the electrons in the plasma in the beam generating chamber 1. Thus, the above cycle is repeated. In this manner, the application of the high-frequency voltage for 10 microseconds and the interruption of the high-frequency voltage for 100 microseconds are alternately repeated. The period of time (100 microseconds) for which the high-frequency voltage is interrupted is sufficiently longer than a period of time in which the electrons in the plasma are attached to the residual process gas to generate negative ions, and sufficiently shorter than a period of time in which the electron density in the plasma is lowered to extinguish the plasma. The period of time (10 microseconds) for which the high-frequency voltage is applied is long enough to recover the energy of the electrons in the plasma which has been lowered during the interruption of the high-frequency voltage.

By interrupting the high-frequency voltage after the energy of the electrons is increased in the plasma, the electrons in the plasma are attached to the residual process gas to generate negative ions. This cycle is repeated to generate negative ions efficiently and continuously. While ordinary plasmas are mostly composed of positive ions and electrons, the neutral particle beam processing apparatus according to the present embodiment can efficiently generate a plasma in which positive ions and negative ions coexist therein. Although the high-frequency voltage is interrupted for 100 microseconds in the above example, it may be interrupted for a period of time ranging from 50 to 100 microseconds to generate a large quantity of negative ions as well as positive ions in the plasma.

After 50 microseconds from the time when the high-frequency voltage applied by the high-frequency power supply 101 is stopped, a DC pulsed voltage of +100 V is applied to the electrode 5 for 50 microseconds by the bipolar power supply 102. The application of the DC voltage lowers the potential Vb of the electrode 6 below the potential of the electrode 5. Thus, a potential difference is produced between the electrode 5 and the meshed electrode 6, which are opposed to each other with interposing the plasma space 7 therebetween. In this state, the electrode 5 serves as an anode, and the meshed electrode 6 serves as a cathode. Therefore, the positive ions in the plasma are accelerated downstream and drifted toward the workpiece X through the drift space 7a. On the contrary, when a DC pulsed voltage of −100 V is applied to the electrode 5 for 50 microseconds by the bipolar power supply 102, the potential Vb of the electrode 6 is higher than the potential of the electrode 5. Thus, a potential difference is produced between the electrode 5 and the meshed electrode 6, which are opposed to each other with interposing the plasma space 7 therebetween. In this state, the electrode 5 serves as a cathode, and the meshed electrode 6 serves as an anode. Therefore, the negative ions in the plasma are accelerated downstream and drifted toward the workpiece X through the drift space 7a.

FIG. 3 is a graph showing a potential distribution between the electrodes 5, 6, in which neutralization of positive or negative ions at a downstream part of the plasma space 7 is schematically shown. FIG. 3 shows that the potential changes gently in the plasma. The positive ions 8 that have reached the downstream region (drift space) 7a in the plasma 7 are neutralized by attachment of electrons in the plasma, by charge exchange with the residual gas, or by charge exchange with negative ions, and converted into neutral particles 4. The negative ions 9 are neutralized by detaching electrons in electron impact, by charge exchange with the residual gas, or by charge exchange with positive ions, and converted into neutral particles 4. Particularly, electrons are detached from the negative ions 9 by a radiation ($h_v$), and the negative ions 9 are converted into neutral particles 4.

The negative ions 9 or the positive ions 8 that have been neutralized, i.e., the neutral particles 4, pass through the meshed electrode 6, and are then emitted as an energetic beam into the process chamber 2. The neutral particles 4 travel directly in the process chamber 2 and are applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

Some charged particles may pass through the mesh in the electrode 6. In order to prevent such charged particles from being applied to the workpiece X, a deflector or an electron trap may be disposed downstream of the electrode 6. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the beam generating chamber 1 according to the type of process to be performed on the workpiece X. For example, in a dry etching process, oxygen or a halogen gas may selectively be used according to the kind of the workpiece X.

In the present embodiment, it is desirable to introduce a gas that is liable to generate negative ions, such as $O_2$, $Cl_2$, $SF_6$, $CHF_3$, or $C_4F_8$, into the beam generating chamber 1 so as to apply neutral particles generated from the negative ions in the plasma. When the application of the high-frequency voltage is interrupted after a high-density plasma is generated by the aforementioned high-frequency inductive coupling (ICP) with use of the above gas, a large number of negative ions can be generated and accelerated in the plasma. Therefore, it is easy to neutralize the negative ions at the downstream part of the plasma space without a particular neutralization device.

In the present embodiment, the bipolar power supply 102 is connected to the upstream electrode 5. The bipolar power supply 102 may be connected to the meshed electrode 6. Alternatively, the bipolar power supply 102 may be connected to both of the upstream and downstream electrodes 5, 6 and may control both of the electrodes 5, 6.

In the present embodiment, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a neutral particle beam processing apparatus for generating a highly directional and highly dense neutral particle beam from a high-density plasma and processing a workpiece with the generated neutral particle beam.

What is claimed is:

1. A neutral particle beam processing apparatus comprising:

a plasma generator for generating at least one of positive ions and negative ions in a plasma;

a pair of electrodes, one of the pair of electrodes being located at an opposite end of said plasma generator in relation to the other electrode of said pair of electrodes; and a power supply for applying a voltage between said pair of electrodes;

wherein said pair of electrodes accelerate said at least one of positive ions and negative ions generated by said plasma generator;

said at least one of positive ions and negative ions are neutralized and converted into neutral particles while being drifted in said plasma between said pair of electrodes toward a workpiece; and said accelerated neutral particles pass through one of said electrodes and are applied to said workpiece.

2. A neutral particle beam processing apparatus according to claim 1, wherein said plasma generator alternately performs application of a high-frequency voltage and interruption of said high-frequency voltage repeatedly; and said at least one of positive ions and negative ions generated by said plasma generator are extracted from said plasma and accelerated in a predetermined direction while said high-frequency voltage is being interrupted.

3. A neutral particle beam processing apparatus according to claim 1, wherein one of said electrodes comprises a meshed electrode.

4. A neutral particle beam processing apparatus according to claim 1, further comprising a drift space through which said at least one of positive ions and negative ions in said plasma are drifted toward said workpiece for thereby being neutralized and converted into neutral particles.

5. A neutral particle beam processing apparatus according to claim 2 wherein application of a voltage applied to said pair of electrodes is synchronized with said application of a high-frequency voltage.

6. A neutral particle beam processing apparatus according to claim 1, wherein said plasma generator is configured to generate at least one of positive ions and negative ions by inductively coupled plasma.

7. A neutral particle beam processing apparatus according to claim 1, further comprising a deflector disposed downstream of pair of electrodes for preventing charged particles from being applied to the workpiece.

8. A neutral particle beam processing apparatus according to claim 1, further comprising an electron trap disposed downstream of said pair of electrodes for preventing charged particles from being applied to the workpiece.

* * * * *